(12) United States Patent
Chu et al.

(10) Patent No.: US 7,266,796 B1
(45) Date of Patent: Sep. 4, 2007

(54) FASTPLACE METHOD FOR INTEGRATED CIRCUIT DESIGN

(75) Inventors: Chris Chong-Nuen Chu, Ames, IA (US); Natarajan Viswanathan, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 68 days.

(21) Appl. No.: 11/102,381

(22) Filed: Apr. 8, 2005

(51) Int. Cl.
*G06F 17/50* (2006.01)

(52) U.S. Cl. ............ 716/9; 716/2; 716/7; 716/11

(58) Field of Classification Search ............ 716/2, 716/7, 9, 11, 12
See application file for complete search history.

(56) References Cited

U.S. PATENT DOCUMENTS 6,067,409 A * 5/2000 Scepanovic et al. ........... 716/8

OTHER PUBLICATIONS

Vygen, Jens "Algorithms for Large-Scale Flat Placement"; 0-89791-847-9/97/0006; DAC97-06/97 Anaheim, CA, USA; 6 pages.
Mo, Fan, et al. "A Force-Directed Macro-Cell Placer"; 0-7803-6445-7/00; pp. 177-180.
Kleinhans, et al. "GORDIAN: VLSI Placement by Quadratic Programming and Slicing Optimization" IEEE Transactions on Computer-Aided Design, vol. 10, No. 3, Mar. 1991; pp. 356-365.
Xiu, Zhong, et al. "Large-Scale Placement by Grid-Warping" DAC 2004, Jun. 7-11, 2004; ACM 1-58113-828-8/04/006; 23.1, pp. 351-356.
Sigl, George, et al. "Analytical Placement: A Linear or a Quadratic Objective Function?" 28th ACM/IEEE Design Automation Conference; 1991 ACM 0-89791-395-7/91/0006; pp. 427-432.
Eisenmann, Hans, et al. "Generic Global Placement and Floorplanning" 1998 ACM 0-89791-964-5/98/06; pp. 269-274.
Etawil, Hussein et al. "Attractor-Repeller Appraoch for Global Placement" 0-7803-5832-X/99; 1999 IEEE; 5 pages.
Hu, Bo, et al. "FAR: Fixed-Points Addition & Relaxation Based Placement" ISPD'02, Apr. 7-10, San Diego, CA; 2002 ACM 1-58113-460/6/02/0004; pp. 161-166.
Kahng, Andrew B., et al. "Implementation and Extensibility of an Analytic Placer" ISPD'04, Apr. 18-21, 2004, Phoenix, AZ; 2004 ACM 1-58113-817-2/04/2004; pp. 18-25.
Hur, Sung-Woo et al. "Mongrel: Hybrid Techniques for Standard Cell Placement" 0-7803-6445-7/00 2000 IEEE; pp. 165-170.
Viswanathan, Natarajan et al. "FastPlace: Efficient Analytical Placement using Cell Shifting, Iterative Local Refinement and a Hybrid Net Model" ISPD'04, Apr. 18-21, 2004, Phoenix, AZ; 2004 ACM 1-58113-817-2/04/0004; pp. 26-33.
Goering, Richard "Grad Student's Paper Promises Far Faster Chip Placement" EE Times Apr. 26, 2004 News article; 1 page.

* cited by examiner

*Primary Examiner*—Thuan Do
(74) *Attorney, Agent, or Firm*—McKee, Voorhees & Sease, P.L.C.

(57) ABSTRACT

A method for efficient analytical placement of standard cell designs includes obtaining a placement of cells using a wirelength objective function, modifying the placement of cells by cell shifting to redistribute cells to thereby reduce cell overlap, and refining the placement of cells to thereby reduce wirelength using a half-perimeter bounding rectangle-measure. Preferably the wirelength the wirelength objective function is a quadratic objective function which is solved using a hybrid net model. The hybrid net model preferably uses a clique model for two-pin and three-pin nets and a star model for nets having at least four pins. The use of the hybrid net model reduces a number of non-zero entries in a connectivity matrix.

15 Claims, 6 Drawing Sheets

FASTPLACE METHOD FOR INTEGRATED CIRCUIT DESIGN

BACKGROUND OF THE INVENTION

The present invention relates to the field of integrated circuit design. More particularly, the present invention relates to a placement algorithm such as may be used for large-scale standard cell designs.

Placement happens to be one of the most persistent challenges in present day Integrated Circuit design. Designs in current deep sub-micron technology often contain over a million placeable components, and are getting larger by the day. Moreover, because of the dominance of interconnect delay, placement has become a major contributor to timing closure results. Placement needs to be performed early in the design flow. Hence, it becomes imperative to have an ultra-fast placement tool to handle the ever increasing placement problem size.

In recent years, many placement algorithms have been proposed to handle the widely-used objective of wire length minimization. These algorithms apply various approaches including analytical placement, simulated annealing, and partitioning/clustering. Analytical placement is the most promising approach for fast placement algorithm design. Analytical placement algorithms commonly utilize a quadratic wire length objective function. Although the quadratic objective is only an indirect measure of the wire length, its main advantage is that it can be minimized quite efficiently. As a result, analytical placement algorithms are relatively efficient in handling large problems. They typically employ a flat methodology so as to maintain a global view of the placement problem. For simulated annealing and partitioning/clustering based approaches, a hierarchical methodology is almost always employed to reduce the problem size to speed up the resulting algorithms. Note that, when the placement problem is so large that a flat analytical approach cannot handle it effectively, a hierarchical analytical approach is beneficial. One of the methods to convert to a hierarchical approach is by incorporating the fine granularity clustering technique proposed by Hu et al. This technique essentially introduces a two-level hierarchy to reduce the size of large-scale placement problems.

A major concern with the quadratic objective is that it results in a placement with a large amount of overlap among cells. Also, the quadratic objective by itself does not give the best possible wire length. To handle these problems, Kleinhans et al., use a placement-based bisection technique to recursively divide the circuit and add linear constraints to pull the cells in each partition to the center of the corresponding region. The FM min-cut algorithm is used to improve the bisection and hence the wire length. Vygen applies a position-based quadrisection technique instead. A splitting-up technique to modify the net list is also proposed to ensure that the cells will stay in the assigned region. The splitting-up technique also breaks down long nets and hence makes the objective behave like a linear function to some extent. Eisenmann et al. introduces additional constant forces to each cell based on cell distribution to pull cells away from dense regions. Etawil et al. adds repelling forces for cells sharing a net to maintain a target distance between them and attractive forces by fixed dummy cells to pull cells from dense to sparse regions. Hu et al. introduces the idea of fixed-point as a more general way to add forces for cell spreading. The last three references mainly focus on cell spreading. They have not discussed ways to improve the wire length by a quadratic objective.

Thus, despite various attempts and approaches at providing efficient analytical placement of cells in integrated circuit design, problems remain.

SUMMARY OF THE INVENTION

Therefore, it is a primary object, feature, or advantage of the present invention to improve over the state of the art.

It is a further object, feature, or advantage of the present invention to provide a fast, iterative, flat placement method for large-scale standard cell designs.

It is a still further object, feature, or advantage of the present invention to provide a method for efficient analytical placement for standard cell designs that eliminates cell overlap.

Another object, feature, or advantage of the present invention is to provide a method for efficient analytical placement for standard cell designs that reduces wirelength.

Yet another object, feature, or advantage of the present invention is to provide a method for efficient analytical placement for standard cell designs that speeds up the process of solving where a quadratic approach is used.

One or more of these and/or other objects, features, or advantages of the present invention will become apparent from the specification and claims that follow.

According to one aspect of the invention, a method for efficient analytical placement of standard cell designs includes obtaining a placement of cells using a wirelength objective function, modifying the placement of cells by cell shifting to redistribute cells to thereby reduce cell overlap, and refining the placement of cells to thereby reduce wirelength using a half-perimeter bounding rectangle-measure. Preferably the wirelength the wirelength objective function is a quadratic objective function which is solved using a hybrid net model. The hybrid net model preferably uses a clique model for two-pin and three-pin nets and a star model for nets having at least four pins. The use of the hybrid net model reduces a number of non-zero entries in a connectivity matrix.

The cell shifting performed is preferably cell shifting in two dimensions. The cell shifting can involve dividing a placement region into bins, computing utilization of each bin to contain cells, and shifting cells in the placement region based upon a bin in which each of the cells lies and current bin utilization. After cell shifting, spreading forces can be added to the cells to prevent collapse into previous positions. The spreading forces can be added by connecting each cell to a corresponding pseudo point added at the boundary of the placement region.

According to another aspect of the invention, an improvement to a quadratic method of placement of cells in a design is provided. The improvement consists of at least one of (1) applying a cell shifting technique to remove cell overlap, (2) applying an iterative local refinement technique to reduce wirelength according to a half-perimeter bounding rectangle-measure, and (3) applying a hybrid net model to reduce a number of non-zero entries in a connectivity matrix.

DETAILED DESCRIPTION OF THE PREFERRED EMBODIMENT

1. Overview

Figure 1:
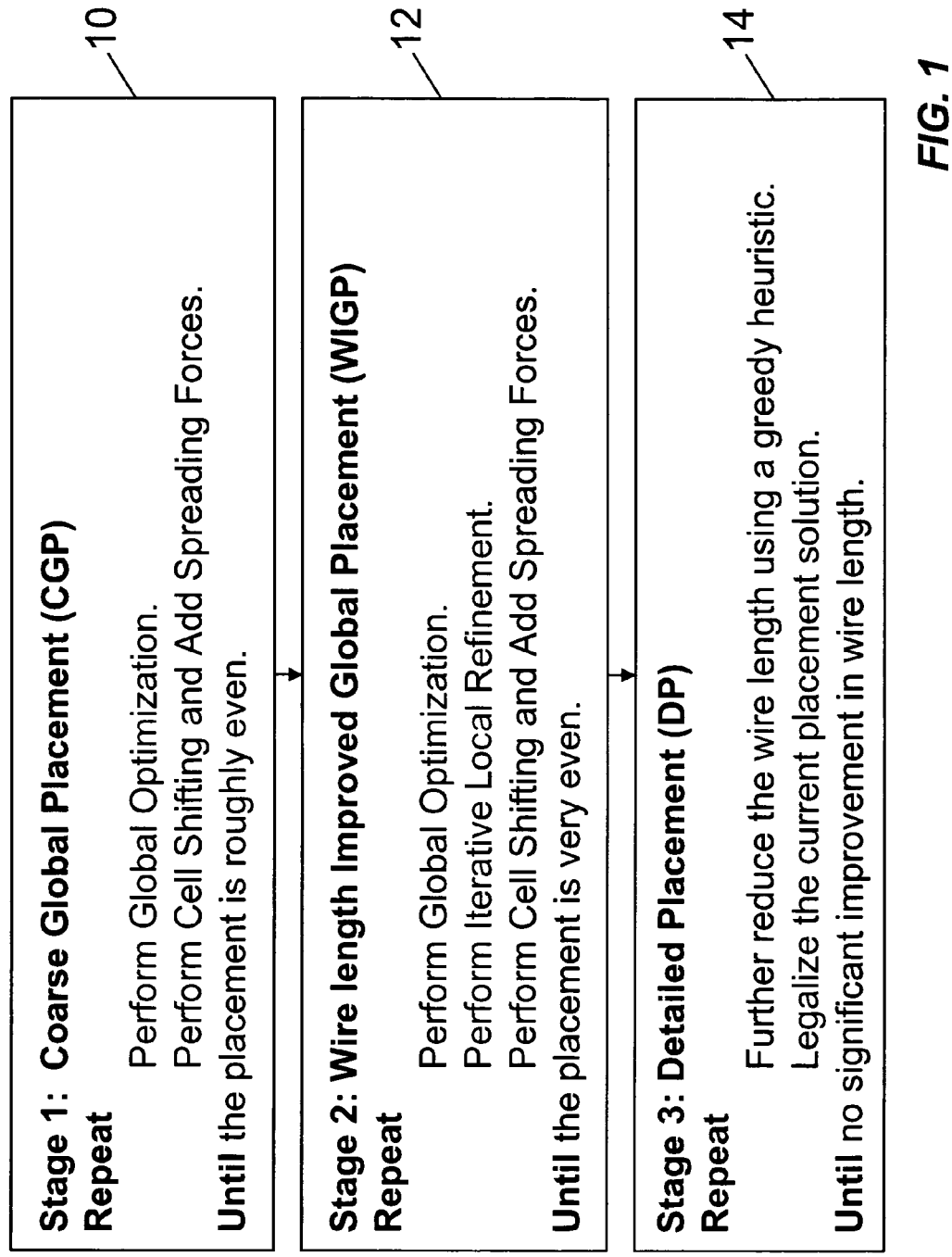
FIG. 1 is a block diagram illustrating an overview of one embodiment of the present invention.

The methodology of one embodiment of the present invention is sometimes referred to as FastPlace and essentially consists of three stages as shown in FIG. 1. FIG. 1 illustrates the first stage 10, the second stage 12, and the third stage 14. The aim of the first stage is to minimize the wire length and spread the cells over the placement region to obtain a coarse global placement. It is composed of an iterative procedure in which we alternate between Global Optimization and Cell Shifting. Global Optimization involves minimizing the quadratic objective function. During Cell Shifting, the entire placement region is divided into equal sized bins and the utilization of each bin is determined. The standard cells are then shifted around the placement region based on the bin in which they lie and its current utilization. Finally, a spreading force is added to all the cells to account for their movement during shifting.

The second stage is to refine the global placement by interleaving an Iterative Local Refinement technique with Global Optimization and Cell Shifting. The Iterative Local Refinement technique is employed to reduce the wire length based on the half-perimeter measure and to speed up the convergence of the algorithm. This stage of global placement yields a very well distributed placement solution with a very good value for the total wire length.

The third stage is that of Detailed Placement. This consists of legalizing the current placement by assigning cells to pre-defined rows in the placement region and removing any overlap among them. It also consists of further reducing the wire length by a greedy heuristic.

2. Global Optimization

This section describes the quadratic programming step of global placement referred to as Global Optimization, which is the terminology used in [13]. The quadratic placement approach uses springs to model the connectivity of the circuit. The total potential energy of the springs, which is a quadratic function of their length, is minimized to produce a placement solution. Equivalently, a force equilibrium state of the spring system is found. In order to model the circuit by a spring system, each multi-pin net needs to be transformed into a set of two-pin nets by a suitable net model. In the following, we assume that this transformation has been applied. The net model used will be discussed in Section 4.

Let n be the number of movable cells in the circuit and $(x_i, y_i)$ the coordinates of the center of cell i. A placement of the circuit is given by the two n-dimensional vectors $x=(x_1, x_2, \ldots, x_n)$ and $y=(y_1, y_2, \ldots, y_n)$. Consider the net between two movable cells i and j in the circuit. Let $W_{ij}$ be its weight. Then the cost of the net between the cells is:

$$\frac{1}{2} W_{ij}[(x_i - x_j)^2 + (y_i - y_j)^2] \quad (1)$$

If a cell i is connected to a fixed cell f with coordinates $(x_f, y_f)$, the cost of the net is given by:

$$\frac{1}{2} W_{if}[(x_i - x_f)^2 + (y_i - y_f)^2] \quad (2)$$

Consequently, the objective function which sums up the cost of all the nets can be written in matrix notation as:

$$\Phi(x, y) = \frac{1}{2} x^T Q x + d_x^T + \frac{1}{2} y^T Q y + d_y^T y + \text{constant} \quad (3)$$

where Q is an n×n symmetric positive definite matrix and $d_x$, $d_y$ are n-dimensional vectors. Since equation (3) is separable into $\Phi(x, y) = \Phi(x) + \Phi(y)$, only the x-dimension is considered for subsequent discussion, which is:

$$\Phi(x) = \frac{1}{2} x^T Q x + d_x^T x + \text{constant} \quad (4)$$

Let $q_{ij}$ be the entry in row i and column j of matrix Q. From expression (1), the cost in the x-direction between two movable cells i and j is $$\frac{1}{2} W_{ij}(x_i^2 + x_j^2 - 2x_i x_j).$$

The first and second terms contribute $W_{ij}$ to $q_{ii}$ and $q_{jj}$ respectively. The third term contributes $-W_{ij}$ to $q_{ij}$ and $q_{ji}$. From expression (2), the cost in the x-direction between a movable cell i and a fixed cell f is $$\frac{1}{2} W_{if}(x_i^2 + x_f^2 - 2x_i \cdot x_f).$$

The first term contributes $W_{if}$ to $q_{ii}$. The third term contributes $-W_{if} x_f$ to the vector $d_x$ at row i and the second term contributes to the constant part of equation (4). The objective function (4) is minimized by solving the system of linear equations represented by:

$$Qx + d_x = 0. \quad (5)$$

Equation (5) gives the solution to the unconstrained problem of minimizing the quadratic function in (4). In FastPlace, we solve such an unconstrained minimization problem throughout the placement process. We do not add any constraint to the problem formulation. This is because the spreading forces added during Cell Shifting are produced by pseudo nets connecting the cells to the chip boundary. This only introduces some terms in the form of expression (2) and causes some changes to the diagonal of matrix Q and the vector $d_x$ as described above.

3. Hybrid Net Model

To handle the large placement problem size, a fast and accurate technique is needed to solve equation (5). Since matrix Q is sparse, symmetric and positive definite, we solve equation (5) by the pre-conditioned Conjugate Gradient method with the Incomplete Cholesky Factorization of matrix Q as the preconditioner. The runtime of this method is directly proportional to the number of nonzero entries in matrix Q. This in turn is equal to the number of two-pin nets in the circuit. Hence, it becomes imperative to choose a good net model so as to have minimal non-zero entries in the matrix Q.

According to one embodiment of the present invention, a Hybrid Net Model is provided. The Hybrid Net Model is a combination of the clique model and the star model. We show experimentally in Section 8 that the Hybrid Net Model reduces the number of non-zero entries in the matrix Q by 2.95 times over the traditional clique model. In the subsequent discussion, we give a brief overview of the clique and star net models, and introduce the Hybrid Net Model. Then, we prove the equivalence of the clique and star models, and hence the consistency of the Hybrid Net Model.

3.1 Clique, Star and Hybrid Net Models

Figure 2B:
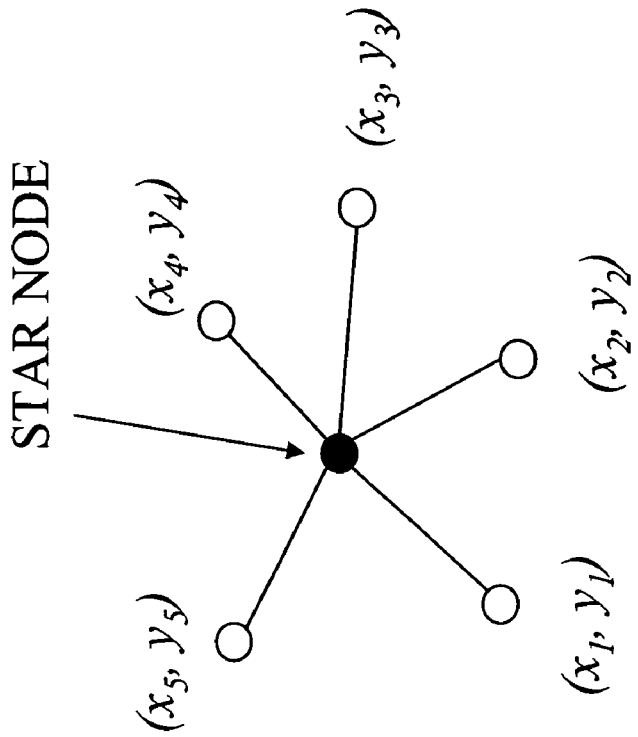
FIG. 2($a$) is a block diagram illustrating the clique model and FIG. 2($b$) is a block diagram illustrating the star model as used in the hybrid model of one embodiment of the present invention.
Figure 2A:
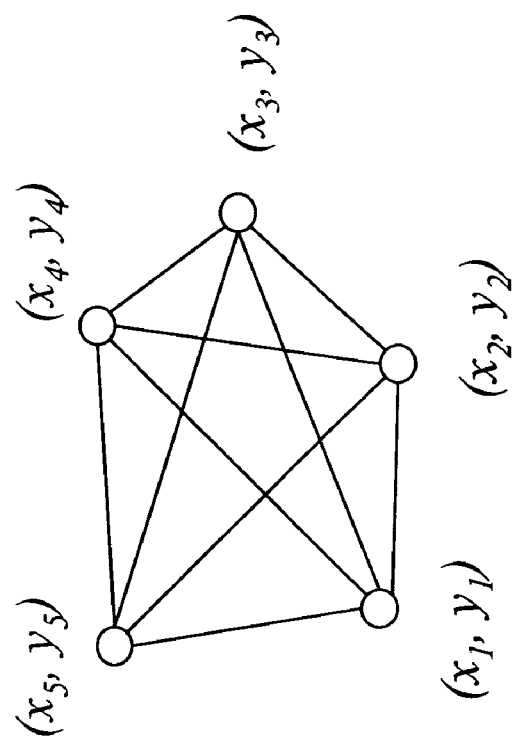

The clique model is the traditional model used in analytical placement algorithms. In the clique model, a k-pin net is replaced by k(k−1)/2 two-pin nets forming a clique. Let W be the weight of the k-pin net. Some commonly used values for the weight of the two-pin nets are W/(k−1) (e.g., [18]) and 2W/k (e.g., [6, 13]). The clique model for a 5-pin net is illustrated in FIG. 2(a).

Recently, Mo et al. utilized the star net model in a macro-cell placer. In the star model, each net has a star node to which all pins of the net are connected. Hence, a k-pin net will yield k two-pin nets. The star model for a 5-pin net is illustrated in FIG. 2(b). Mo et al. points out that the clique model generates on average 30% more two-pin nets than the star model for the MCNC92 macro block benchmarks, even though a star node is created in their model even for two-pin nets. Vygen also switches to a star model for very large nets to reduce the number of terms in the objective function, but has not shown the validity of mixing the clique and star models in quadratic placement. In addition, neither paper has discussed the method to set the weight of the nets introduced by the star model.

In the following subsection we prove that for a k-pin net of weight W, if we set the weight of the two-pin nets introduced, to $\gamma W$ in the clique model and $k\gamma W$ in the star model for any $\gamma$, the clique model is equivalent to the star model. Therefore, the two models can be used interchangeably. We propose a Hybrid Net Model which uses a clique model for two-pin and three-pin nets, and a star model for nets with four or more pins. We set $\gamma$ to 1/(k−1) in FastPlace as it works better experimentally. By using the star model for nets with four or more pins, we will generate much fewer nets and consequently fewer non-zero entries in the matrix Q, than the clique model. By using the clique model for two-pin nets, we will not introduce one extra net and two extra variables per two-pin net as in. We choose to use the clique model for three-pin nets because it is better than the star model for the following reasons: First, if two cells are connected by more than one two-pin or three-pin net in the original net list, the two-pin nets generated by the clique model between the two cells can be combined and will only introduce a single non-zero entry in the matrix Q. Second, there is no need to introduce an extra pair of variables.

3.2 Equivalence of the Hybrid Net Model to the Clique and Star Net Models

In this subsection, we show that the clique model is equivalent to the star model in quadratic placement if net weights are set appropriately. It follows that the clique, star and Hybrid net models are all equivalent.

LEMMA 1. For any net in the star model, the star node under force equilibrium is at the center of gravity of all pins of the net.

PROOF. Consider a k-pin net. Let $x_s$ be the x-coordinate of the star node and let $W_s$ be the weight of the two-pin nets introduced. Then the total force on the star node by all the pins is given by:

$$F = \sum_{j=1}^{k} W_s(x_j - x_s).$$

Under force equilibrium, the total force F=0. Therefore, $$x_s = \frac{\sum_{j=1}^{k} x_j}{k} \qquad (6)$$

Hence the lemma follows.

THEOREM 1. For a k-pin net, if the weight of the two-pin nets introduced is set to $W_c$ in the clique model and $kW_c$ in the star model, the clique model is equivalent to the star model in quadratic placement.

PROOF. For the clique model, the total force on a pin i by all the other pins is given by:

$$F_i^{clique} = W_c \sum_{j=1, j \neq i}^{k} (x_j - x_i) \qquad (7)$$

For the star model, all the pins of the net are connected to the star node. The force on a pin i due to the star node is given by:

$$F_i^{star} = kW_c(x_s - x_i)$$

$$= kW_c \left( \frac{\sum_{j=1}^{k} x_j}{k} - x_i \right) \text{ by Lemma 1}$$

$$= W_c \left( \sum_{j=1}^{k} x_j - kx_i \right)$$

$$= W_c \sum_{j=1, j \neq i}^{k} (x_j - x_i)$$

$$= F_i^{clique}$$

As the forces are the same in both models for all pins, the lemma follows.

4. Cell Shifting

Global Optimization gives a placement which minimizes the quadratic objective function. However, it does not consider the overlap among cells. Therefore, the resulting placement has a lot of cell overlap and is not distributed over the placement area. Cell Shifting evens out the placement by distributing the cells over the placement region while retaining their relative ordering obtained during the Global Optimization step.

4.1 Calculation of Bin Utilization

Figure 3:
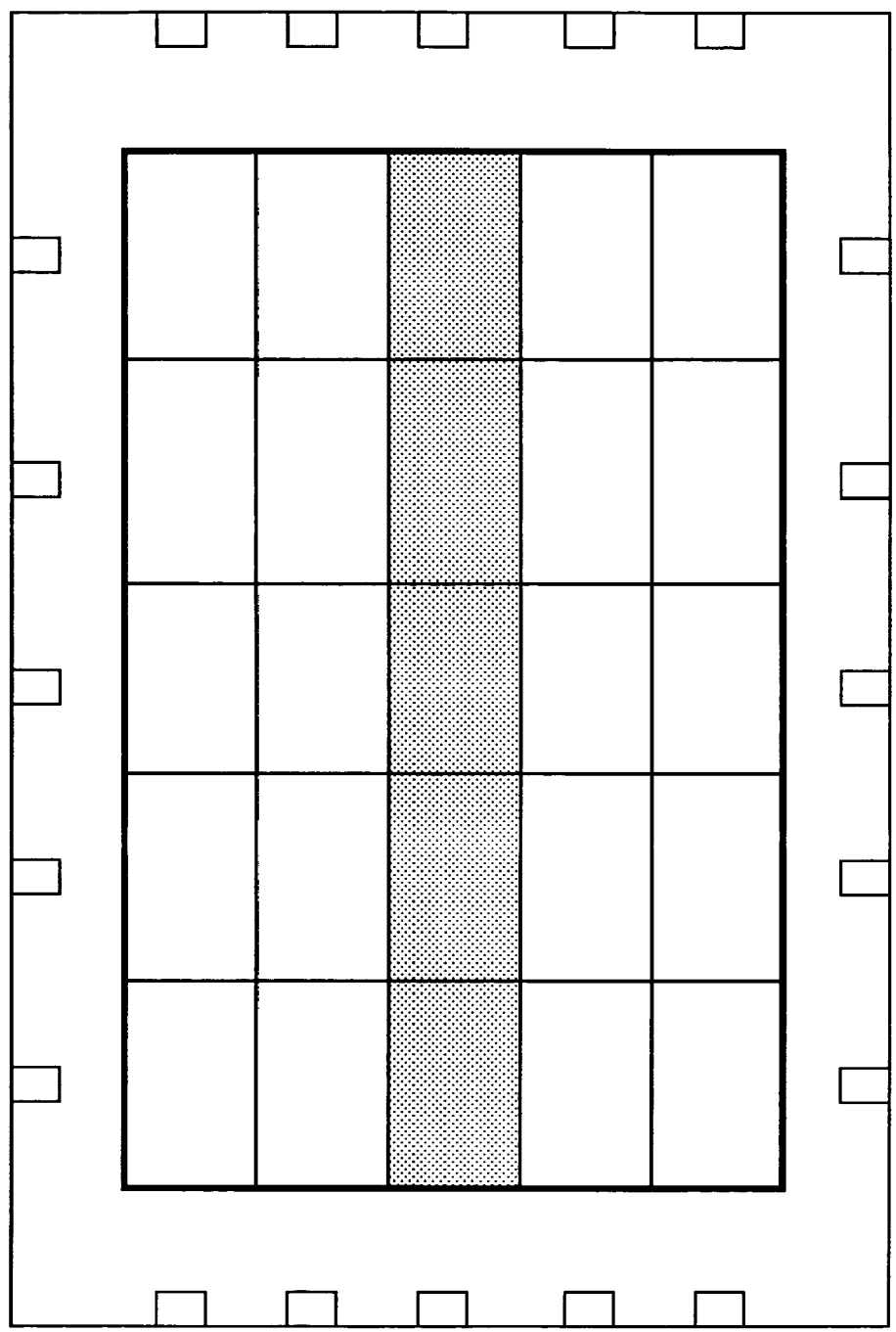
FIG. 3 illustrates a regular bin structure.

Initially, the placement region is divided into equal sized bins as shown in FIG. 3. The area of each bin is such that it can accommodate an average of 4 cells. Based on the placement obtained from the Global Optimization step, the utilization of each bin ($U_i$) is then computed. $U_i$ is defined as the total area of all cells inside bin i. In calculating $U_i$ we sum the areas of all standard cells which are completely covered by bin i and the overlap area between the bin and the standard cell for cells which partially overlap with bin i. The standard cells are then shifted around the placement region based upon the bin in which they lie and its current utilization.

4.2 Shifting of Cells

Let us consider the case where the cells are shifted in the x-dimension. To shift cells in the x-dimension, we go through every row of the regular bin structure and move cells present in the row. Shifting of cells is a two step process. First, based on the current utilization of all the bins in a particular row an unequal bin structure reflecting the current bin utilization is constructed. Second, every cell belonging to a particular bin in the regular bin structure is then linearly mapped to the corresponding bin in the unequal bin structure. As a result of this mapping, cells in bins with a high utilization will shift in a way so as to reduce its utilization and the overlap among themselves. For shifting cells in the y-dimension we consider every column of the regular bin structure, after all the rows have been considered and follow the two steps mentioned above.

Figure 4:
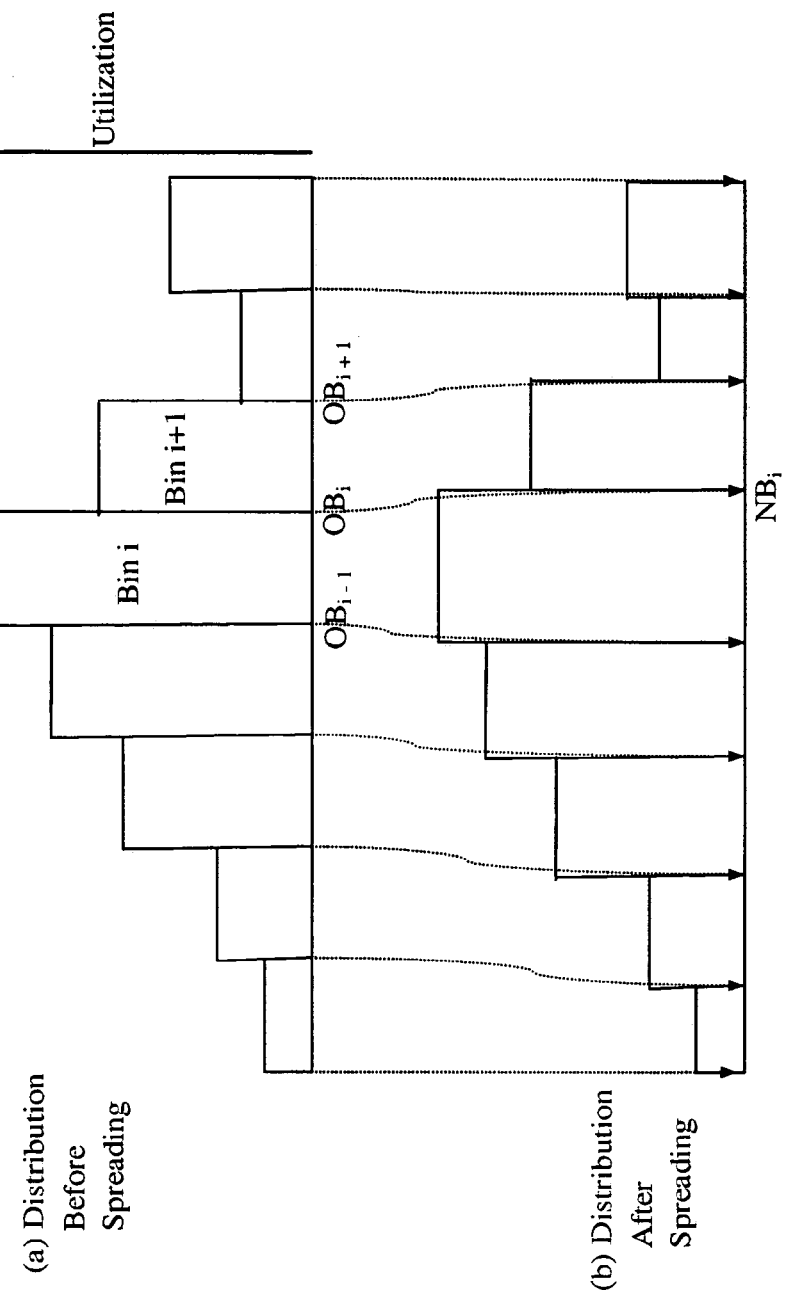
FIG. 4 illustrates regular bin structure shown distribution before spreading and unequal bin structure and utilization after shifting.

To illustrate the shifting in the x-direction, consider a particular row in the regular bin structure (shaded row in FIG. 3). The utilization of all the bins in this row is given in FIG. 4(a). The unequal bin structure constructed from the regular bin structure is illustrated in FIG. 4(b). To get the equation for the new bin structure, from FIG. 4 let, $OB_i$: x-coordinate of the boundary of bin i corresponding to the regular bin structure $NB_i$: x-coordinate of the boundary of bin i corresponding to the unequal bin structure Then, $$NB_i = \frac{OB_{i-1}(U_{i+1} + \delta) + OB_{i+1}(U_i + \delta)}{U_i + U_{i+1} + 2\delta} \quad (8)$$

The intuition behind the above formula is to construct the new bin such that it averages the utilization of bin i and bin i+1. The reason for having the parameter $\delta$ is as follows: Let, $\delta=0$ and $U_i+1=0$, then from equation (8) it can be seen that, $NB_i=OB_{i+1}$, and $NB_{i+1}=OB_i$. This results in a cross-over of bin boundaries in the new bin structure which results in improper mapping of the cells. To avoid this cross-over we need the parameter $\delta$ which is set to a value of 1.5.

For performing the linear mapping of cells, If, $x_j$: x-coordinate of cell j in bin i before mapping (obtained from the Global Optimization step)

$x'_j$: x-coordinate of cell j in bin i after mapping

Then, $$\frac{x_j - OB_{i-1}}{OB_i - OB_{i-1}} = \frac{x'_j - NB_{i-1}}{NB_i - NB_{i-1}}$$

or, $$x'_j = \frac{NB_i(x_j - OB_{i-1}) + NB_{i-1}(OB_i - x_j)}{OB_i - OB_{i-1}}$$

During the initial placement iterations, bins in the center of the placement region have an extremely high bin utilization value. Consequently, cells in such bins will have a tendency to shift over large distances. This will perturb the current placement solution by a large amount. This effect will get added over iterations and result in a final placement with a high value of the total wire length.

Therefore, to control the actual distance moved by any cell during shifting, we introduce two movement control parameters, $a_x$ and $a_y$ ($<1$) for the x and y dimensions. $a_x$ and $a_y$ are increasing functions, inversely proportional to the maximum bin utilization and have a very small value during the initial placement iterations. For the x-dimension, the actual distance moved by cell j is $a_x|x'_j-x_j|$. This is just a fraction of the total distance to be moved by the cell.

This way, the cells are shifted over very small distances during the initial placement iterations. During the later placement iterations, the cells will be distributed quite evenly and hence will not have a tendency to shift over large distances. Then, a can take a larger value to accelerate convergence. The expressions for $a_x$ and $a_y$ are:

$$\alpha_y = 0.02 + \frac{0.5}{\max(U_i)}$$

$$\alpha_x = 0.02 + \left(\frac{0.5}{\max(U_i)}\right)\left(\frac{averageCellWidth}{cellHeight}\right)$$

4.3 Addition of Spreading Forces

Figure 5:
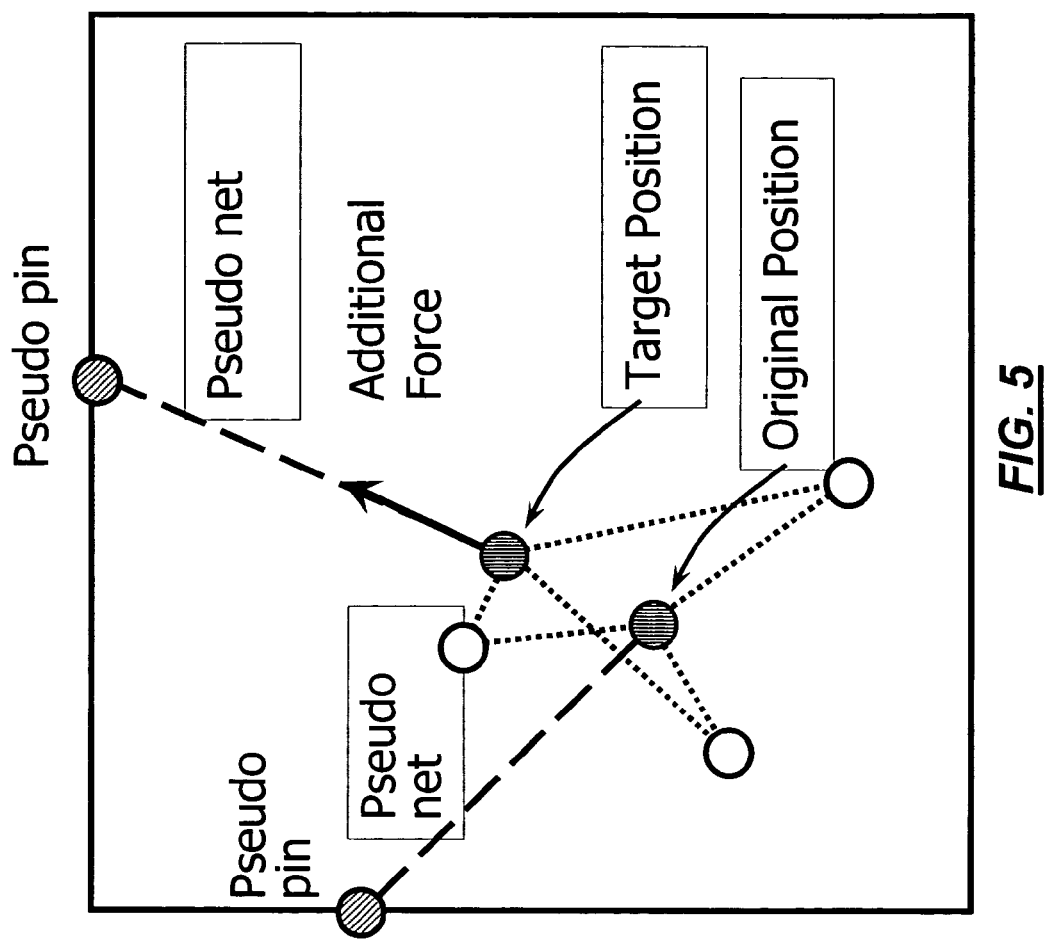
FIG. 5 illustrates a pseudo pin and pseudo net addition used to add spreading forces.

After the cells have been shifted in the x and y dimensions, additional forces need to be added to them so that they do not collapse back to their previous positions during the next Global Optimization step. This is achieved by connecting each cell to a corresponding pseudo pin added at the boundary of the placement region. The pseudo pin and pseudo net addition is illustrated in FIG. 5.

Let $(x_j,y_j)$ and $x_j^f$, $y_j^f$ be the original and target position of cell j before and after Cell Shifting. Since $(x_j,y_j)$ is the equilibrium position obtained by the Global Optimization step, the total force acting on cell j in this position is zero. When it is moved to the target position it will experience a force due to its connectivity with the other cells or star nodes in the placement region. This force can also be viewed as the force required to move the cell from the original to the target position. The spreading force added to the cell corresponds to this force experienced by it in its target position. During each iteration of Global Placement, the spreading forces are generated afresh based on the cell positions obtained after the Cell Shifting step. They are not accumulated over iterations. If, pF$_x$: x-component of resultant force on cell j at its target position due to cells/star nodes connected to it.
pF$_y$: y-component of the force
pD$_x$: x-component of the distance between the pseudo pin and target position of cell j
pD$_y$: y-component of the distance Then, the position of the pseudo pin can be determined by the intersection of the resultant force vector with the chip boundary. A pseudo net for cell j is one which connects the cell from its target position to its pseudo pin. The spring constant for the pseudo net is given by $$\beta = \frac{\sqrt{pF_x^2 + pF_y^2}}{\sqrt{pD_x^2 + pD_y^2}}.$$

Since the pseudo pin is a fixed pin present at the boundary, we know from expression (2) and the subsequent analysis in Section 3, that only the diagonal of matrix Q and the d$_x$ and d$_y$ vectors need to be updated for every cell. Hence, it takes only a single pass of O(n) time, where n is the total number of movable cells in the circuit, to regenerate the connectivity matrix for the next Global Optimization step. Thus we have incorporated an extremely fast Cell Shifting technique to distribute the cells over the placement region.

5. Iterative Local Refinement

As previously stated, the quadratic objective function on its own does not yield the best possible result in terms of wire length as it is just an indirect measure of the linear wire length. To offset this disadvantage, we incorporate an Iterative Local Refinement technique to further reduce the wire length.

The Iterative Local Refinement technique is interleaved with the Cell Shifting and Global Optimization steps during the WIGP stage. This technique acts on a coarse global placement obtained from the previous stage and hence is very effective in minimizing the wire length. Unlike other approaches, this technique uses the actual position of a cell and the half-perimeter bounding rectangle measure of all nets connected to the cell for moving it around the placement region. The technique is based on a greedy heuristic which mainly tries to minimize the wire length while trying to reduce the current maximum bin utilization so as to speed-up the convergence of the algorithm.

5.1 Bin Structure

This technique also employs a regular bin structure to estimate the current utilization of a placement region for performing wire length improvement. Cells are then moved from source to target bins based upon the wire length improvement and target bin utilization. During the first iteration of the WIGP stage, the width and height of each bin for the Refinement is set to 5 times that of the bin used during Cell Shifting. Such large bins are constructed to enable cell movement over large distances. This is to minimize the wire length of long nets which might span a large part of the placement area. The width and height of the bins are gradually brought down to the values used in the Cell Shifting step over subsequent iterations of the WIGP stage.

5.2 Description of the Technique

Once the utilization of all the bins in the placement region has been determined, we traverse through all the cells in the placement region and determine their respective source bins. For every cell present in a bin we compute four scores corresponding to the four possible cell movement directions. For calculating the score, we assume that a cell is moving from its current position in a source bin to the same position in a target bin which is adjacent to it. That is, we move the cell by one bin width. Each score is a weighted sum of two components: The first being the wire length reduction for the move. The wire length is computed as the total half-perimeter of the bounding rectangle of all nets connected to the cell. Hence it is much more accurate than the quadratic objective function used in the Global Optimization step. The second being a function of the utilization of the source and target bins. Since the Local Refinement technique is mainly used to reduce the wire length, a higher weight is used for the first component. If all the four scores are negative, the cell will remain in the current bin. Otherwise, it will move to the target bin with the highest score for the move. During one iteration of the Local Refinement, we traverse through all the bins in the placement region and follow the above steps for cell movement. Subsequently, this iteration is repeated until there is no significant improvement in the wire length.

The Iterative Local Refinement technique is then followed by Cell Shifting in which we add the spreading forces as described previously to reflect the current placement.

6. Detailed Placement

The Detailed Placement stage legalizes the solution obtained from global placement. It assigns all the standard cells to pre-defined rows in the placement region. Within each row, the cells are then assigned to legal positions. Once the cells are assigned to the rows in the placement region, any remaining overlap among them is removed. During legalization, the detailed placement also tries to further reduce the wire length by employing a technique similar to Iterative Local Refinement. The difference is that during detailed placement, the technique acts on cells which have been assigned to the actual rows present in the placement region. Besides, it puts a higher weight on the utilization factor than the wire length factor because the emphasis is on removal of overlap among cells to obtain a legalized placement.

7. Experimental Results

TABLE 1

Placement Benchmark Statistics.

| Ckt | # Nodes | # Tnls | # Nets | # Pins | # Rows |
|---|---|---|---|---|---|
| ibm01 | 12506 | 246 | 14111 | 50566 | 96 |
| ibm02 | 19342 | 259 | 19584 | 81199 | 109 |
| ibm03 | 22853 | 283 | 27401 | 93573 | 121 |
| ibm04 | 27220 | 287 | 31970 | 105859 | 136 |
| ibm05 | 28146 | 1201 | 28446 | 126308 | 139 |
| ibm06 | 32332 | 166 | 34826 | 128182 | 126 |
| ibm07 | 45639 | 287 | 48117 | 175639 | 166 |
| ibm08 | 51023 | 286 | 50513 | 204890 | 170 |
| ibm09 | 53110 | 285 | 60902 | 222088 | 183 |
| ibm10 | 68685 | 744 | 75196 | 297567 | 234 |
| ibm11 | 70152 | 406 | 81454 | 280786 | 208 |
| ibm12 | 70439 | 637 | 77240 | 317760 | 242 |

TABLE 1-continued

Placement Benchmark Statistics.

| Ckt | # Nodes | # Tnls | # Nets | # Pins | # Rows |
|---|---|---|---|---|---|
| ibm13 | 83709 | 490 | 99666 | 357075 | 224 |
| ibm14 | 147088 | 517 | 152772 | 546816 | 305 |
| ibm15 | 161187 | 383 | 186608 | 715823 | 303 |
| ibm16 | 182980 | 504 | 190048 | 778823 | 347 |
| ibm17 | 184752 | 743 | 189581 | 860036 | 379 |
| ibm18 | 210341 | 272 | 201920 | 819697 | 361 |

The benchmarks used in our experiments are derived from the ISPD-02 suite downloaded from. These benchmarks consist of macro blocks and hence had to be modified to be tested on FastPlace. The height of all the macro blocks was brought down to the standard cell height. The average width of all the modules in the original benchmark was computed and the width of all macros exceeding 4 times the average width was assigned to a value of 4× average width. All designs in the derived set have a whitespace of 10%. The IBM-Place Benchmarks used in Dragon cannot be used because they do not have any connectivity information between the movable cells and the fixed terminals on the placement boundary. This information is essential for a quadratic placement approach. Statistics for the placement benchmarks are given in Table 1.

To determine the effect of the Hybrid net model on the number of entries in matrix Q and on the runtime, we consider two implementations of FastPlace in C. One incorporating the clique model and the other incorporating the Hybrid net model. Table 2 gives the results for the two implementations. It can be seen that on average, the Hybrid model leads to 2.95× fewer non-zero entries in matrix Q as compared to the clique model over the 18 benchmark circuits. Also, on average, the total runtime of the placer is 1.5× lesser for the Hybrid net model.

TABLE 3 gives a break-up of the total runtime of FastPlace for all circuits. We incorporate the Hybrid net model in

| | # Non-zero Entries | | Ratio (# Clique/ | Runtime (Clique/ |
|---|---|---|---|---|
| Ckt | (Clique) | (Hybrid) | # Hybrid) | Hybrid) |
| ibm01 | 109183 | 41164 | 2.65 | 1.5 |
| ibm02 | 343409 | 70014 | 4.90 | 2.4 |
| ibm03 | 206069 | 74680 | 2.76 | 1.4 |
| ibm04 | 220423 | 84556 | 2.61 | 1.2 |
| ibm05 | 349676 | 108282 | 3.23 | 1.3 |
| ibm06 | 321308 | 106835 | 3.01 | 1.6 |
| ibm07 | 373328 | 147009 | 2.54 | 1.3 |
| ibm08 | 732550 | 173541 | 4.22 | 2.0 |
| ibm09 | 478777 | 185102 | 2.59 | 1.4 |
| ibm10 | 707969 | 251101 | 2.82 | 1.6 |
| ibm11 | 508442 | 230865 | 2.20 | 1.2 |
| ibm12 | 748371 | 270849 | 2.76 | 1.6 |
| ibm13 | 744500 | 295048 | 2.52 | 1.5 |
| ibm14 | 1125147 | 456474 | 2.46 | 1.3 |
| ibm15 | 1751474 | 607289 | 2.88 | 1.4 |
| ibm16 | 1923995 | 668491 | 2.88 | 1.3 |
| ibm17 | 2235716 | 753507 | 2.97 | 1.4 |
| ibm18 | 2221860 | 711702 | 3.12 | 1.4 |
| Avg | | | 2.95 | 1.5 |

TABLE 2

Clique net model vs Hybrid net model.
FastPlace to obtain these results. Columns 2-4 of Table 3 give the Global Optimization, Cell Shifting, Iterative Local Refinement and Detailed Placement times respectively. It can be seen that on average, Cell Shifting takes only 9.6% of the total runtime over the 18 benchmarks. This demonstrates the efficiency of the Cell Shifting technique in distributing the cells over the placement region in a very short time.

| Ckt | Global Opt. (sec) | Cell Shifting (sec) | Iterative Local Refinement (sec) | Det. Place (sec) | Total Time |
|---|---|---|---|---|---|
| ibm01 | 3.75 | 1.44 | 6.37 | 1.55 | 13 s |
| ibm02 | 8.43 | 3.05 | 17.87 | 3.83 | 33 s |
| ibm03 | 10.03 | 3.59 | 16.74 | 2.12 | 33 s |
| ibm04 | 11.83 | 4.13 | 19.72 | 3.55 | 39 s |
| ibm05 | 10.91 | 6.23 | 25.83 | 8.27 | 51 s |
| ibm06 | 13.27 | 3.91 | 25.04 | 3.21 | 45 s |
| ibm07 | 33.12 | 7.81 | 33.09 | 4.47 | 1 m 19 s |
| ibm08 | 32.19 | 8.94 | 44.47 | 7.31 | 1 m 33 s |
| ibm09 | 43.03 | 12.47 | 37.40 | 8.65 | 1 m 42 s |
| ibm10 | 57.91 | 12.38 | 62.03 | 12.35 | 2 m 25 s |
| ibm11 | 56.80 | 14.67 | 49.20 | 11.86 | 2 m 13 s |
| ibm12 | 59.78 | 12.43 | 59.71 | 10.55 | 2 m 23 s |
| ibm13 | 81.31 | 17.30 | 63.98 | 11.80 | 2 m 54 s |
| ibm14 | 144.06 | 32.50 | 135.30 | 21.90 | 5 m 34 s |
| ibm15 | 230.72 | 43.32 | 214.36 | 36.06 | 8 m 45 s |
| ibm16 | 257.41 | 53.93 | 292.74 | 47.99 | 10 m 52 s |
| ibm17 | 251.69 | 39.24 | 348.08 | 51.37 | 11 m 30 s |
| ibm18 | 285.57 | 57.09 | 345.28 | 52.98 | 12 m 21 s |

Table 3: Break-up of total runtime.

FastPlace is compared with two state-of-the-art academic placers—Capo 8.8 and Dragon 2.2.3. All experiments are run on a Sun Sparc-2, 750 MHz machine. We run MetaPl-Capo8.8 for Solaris, which incorporates Capo, orientation optimizer and row ironing, in the default mode. Dragon is run in the fixed die mode. The half-perimeter wire length and runtime results of Capo, Dragon and Fast-Place are given in Table 4.

From column 10 of Table 4, it can be seen that on average, FastPlace is 13.0 times faster than Capo over the 18 benchmarks. The average wire length of FastPlace, from column 5, is just 1.0% higher than Capo. From column 11 of Table 4, it can be seen that on average, FastPlace is 97.4 times faster than Dragon. The average wire length of FastPlace, from column 6, is just 1.6% higher than Dragon.

Figure 6:
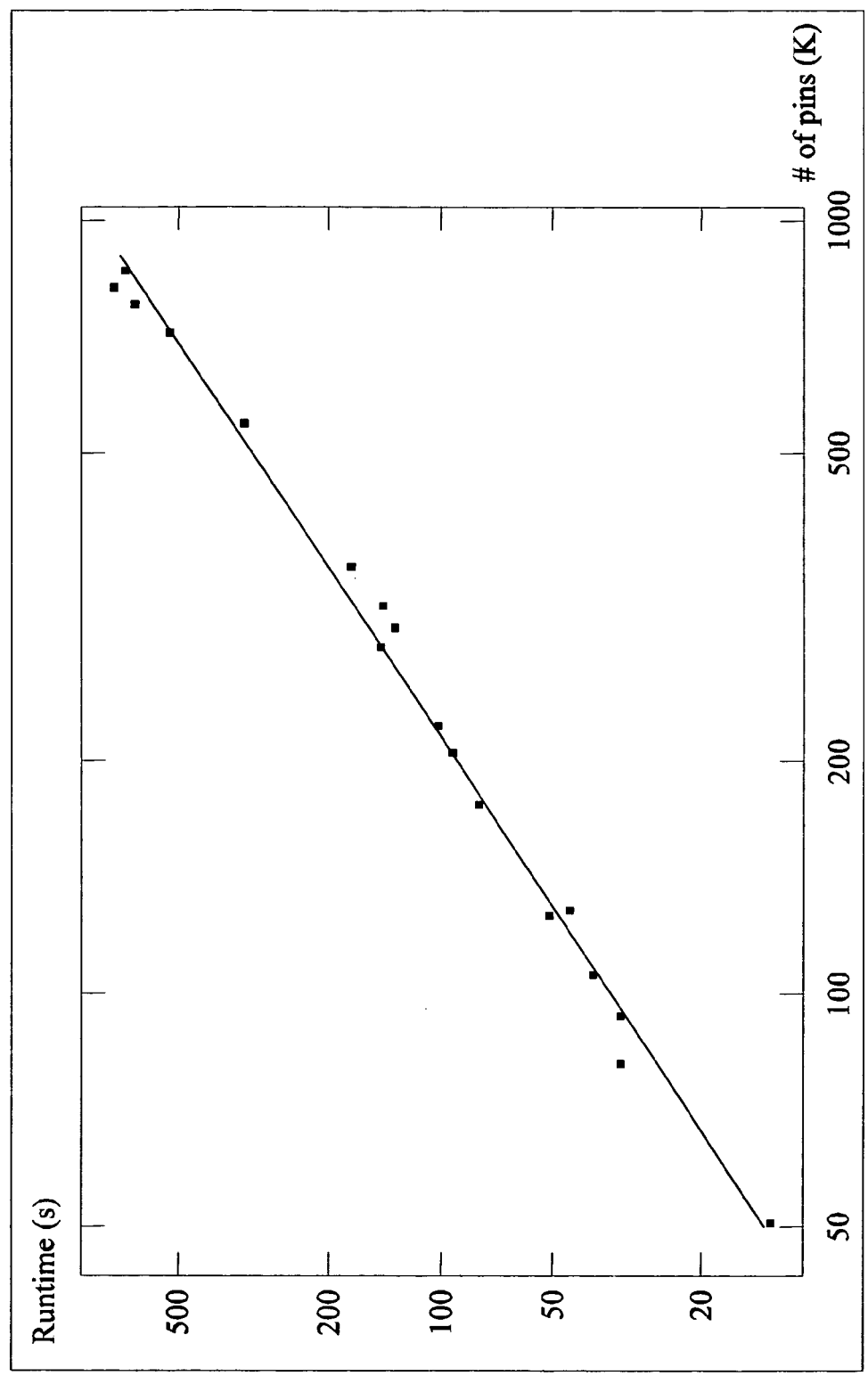
FIG. 6 is a graph illustrating runtime of one embodiment of the present invention versus the number of points in circuits on a logarithmic scale.

To determine the scalability factor of FastPlace, we plot the runtime versus the total number of pins, which is a good measure of the circuit size, in logarithmic scale for all 18 benchmarks in FIG. 6. The data points can be closely approximated by a straight line with slope 1.370. Hence, the runtime of FastPlace is roughly $O(n^{1.370})$, where n is the circuit size given by the number of pins.

TABLE 4

Comparison of placement results with Capo 8.8 and Dragon 2.2.3.

| Ckt | Half-Perimeter Wire length | | | Wire length Ratio | | RunTime | | | Speed-up | |
|---|---|---|---|---|---|---|---|---|---|---|
| | Capo (x1e6) | Dragon (x1e6) | FastPlace (x1e6) | FastPlace Capo | FastPlace Dragon | Capo | Dragon | FastPlace | FastPlace | FastPlace |
| ibm01 | 1.86 | 1.84 | 1.91 | 1.03 | 1.04 | 3 m 59 s | 29 m 6 s | 13 s | x18.4 | x134.3 |
| ibm02 | 4.06 | 3.98 | 4.02 | 0.99 | 1.01 | 7 m 15 s | 31 m 13 s | 33 s | x13.2 | x56.8 |
| ibm03 | 5.11 | 5.31 | 5.45 | 1.07 | 1.03 | 8 m 23 s | 31 m 49 s | 33 s | x15.2 | x57.8 |
| ibm04 | 6.39 | 6.22 | 6.63 | 1.04 | 1.07 | 10 m 46 s | 1 h 5 m | 39 s | x16.6 | x100.0 |
| ibm05 | 10.56 | 10.35 | 10.96 | 1.04 | 1.06 | 10 m 44 s | 1 h 48 m | 51 s | x12.6 | x127.1 |
| ibm06 | 5.50 | 5.45 | 5.55 | 1.01 | 1.02 | 12 m 08 s | 1 h 21 m | 45 s | x16.2 | x108.0 |
| ibm07 | 9.63 | 9.26 | 9.56 | 0.99 | 1.03 | 18 m 32 s | 1 h 47 m | 1 m 19 s | x14.1 | x81.3 |
| ibm08 | 10.26 | 9.66 | 10.01 | 0.98 | 1.04 | 19 m 53 s | 4 h 30 m | 1 m 33 s | x12.8 | x174.2 |
| ibm09 | 10.56 | 11.03 | 11.26 | 1.07 | 1.02 | 22 m 50 s | 3 h 43 m | 1 m 42 s | x13.4 | x131.2 |
| ibm10 | 19.70 | 19.46 | 19.31 | 0.98 | 0.99 | 29 m 04 s | 3 h 19 m | 2 m 25 s | x12.0 | x82.3 |
| ibm11 | 15.73 | 15.36 | 16.03 | 1.02 | 1.04 | 31 m 11 s | 2 h 22 m | 2 m 13 s | x14.1 | x64.1 |
| ibm12 | 25.83 | 24.74 | 25.04 | 0.97 | 1.01 | 30 m 41 s | 3 h 48 m | 2 m 23 | x12.9 | x95.7 |
| ibm13 | 18.73 | 19.32 | 19.46 | 1.04 | 1.01 | 39 m 27 s | 3 h 4 m | 2 m 54 s | x13.6 | x63.4 |
| ibm14 | 36.69 | 35.77 | 36.09 | 0.98 | 1.01 | 1 h 12 m | 7 h 37 m | 5 m 34 s | x12.9 | x82.1 |
| ibm15 | 43.85 | 43.39 | 45.21 | 1.03 | 1.04 | 1 h 30 | 10 h 34 m | 8 m 45 s | x10.3 | x72.4 |
| ibm16 | 49.63 | 49.54 | 48.43 | 0.97 | 0.98 | 1 h 31 | 12 h 6 m | 10 m 52 s | x8.4 | x66.8 |
| ibm17 | 69.07 | 73.45 | 68.09 | 0.99 | 0.93 | 1 h 43 m | 26 h 54 m | 11 m 30 s | x9.0 | x140.3 |
| ibm18 | 47.46 | 48.59 | 46.89 | 0.99 | 0.96 | 1 h 44 m | 23 h 39 m | 12 m 21 s | x8.4 | x114.9 |
| Average | | | | 1.010 | 1.016 | | | | x13.0 | x97.4 |

8. Options, Variations, and Alternatives

The present invention provides an efficient and scalable flat placement algorithm FastPlace for large-scale standard cell circuits. FastPlace is based on the analytical placement approach and utilizes the quadratic wire length objective function. The current implementation handles the wire length minimization problem. It produces comparable placement solutions to state-of-the-art academic placers, but in a significantly lesser runtime. Such an ultra-fast placement tool is very much needed for the timing convergence of the layout phase of IC design.

The runtime of FastPlace can be further reduced by incorporating it into the FPI framework in or a general hierarchical framework, and by applying the algebraic multi-grid method to solve the system of linear equations (5). The FastPlace algorithm can also be extended to consider other placement objectives like mixed-mode placement, timing driven placement, routing congestion, variable whites-pace allocation, etc. Future extensions to the algorithm would be in dealing with the above objectives.

Thus, it should be apparent that the present invention provides an improved method for placement with broad scope and is not limited to the specific embodiments described herein. For example, the present invention contemplates numerous variations including variations in the wirelength objective function used, variations in cell shifting techniques used to remove cell overlay, variations in iterative local refinement techniques used, variations in the model used to simplify solving of the wirelength objective functions, use of objectives in addition to or in place of the wirelength objective function, implementation in any number of different computer languages, variations in software parameters, and other variations.

9. References

[1] http://vlsicad.eecs.umich.edu/BK/ISPD02bench/.

[2] R. Barrett, M. Berry, and et al. *Templates for the Solution of Linear Systems: Building Blocks for Iterative Methods*. SIAM, 1994.

[3] A. E. Caldwell, A. B. Kahng, and I. L. Markov. Can recursive bisection produce routable placements. In *Proc. ACM/IEEE Design Automation Conf.*, pages 477-482, 2000.

[4] T. Chan, J. Cong, T. Kong, and J. Shinnerl. Multilevel optimization for large-scale circuit placement. In *Proc. IEEE/ACM Intl. Conf. on Computer-Aided Design*, pages 171-176, 2000.

[5] H. Chen, C.-K. Cheng, N.-C. Chou, A. Kahng, J. MacDonald, P. Suaris, B. Yao, and Z. Zhu. An algebraic multigrid solver for analytical placement with layout based clustering. In *Proc. ACM/IEEE Design Automation Conf.*, pages 794-799, 2003.

[6] H. Eisenmann and F. Johannes. Generic global placement and floorplanning. In *Proc. ACM/IEEE Design Automation Conf.*, pages 269-274, 1998.

[7] H. Etawil, S. Arebi, and A. Vannelli. Attractor-repeller approach for global placement. In *Proc. IEEE/ACM Intl. Conf on Computer-Aided Design*, pages 20-24, 1999.

[8] C. M. Fiduccia and R. M. Mattheyses. A linear-time heuristic for improving network partitions. In *Proc. ACM/IEEE Design Automation Conf.*, pages 175-181, 1982.

[9] K. M. Hall. An r-dimensional quadratic placement algorithm. *Management Science,* 17:219-229, 1970.

[10] B. Hu and M. Marek-Sadowska. Far: Fixed-points addition and relaxation based placement. In *Proc. Intl. Symp. on Physical Design*, pages 161-166, 2002.

[11] B. Hu and M. Marek-Sadowska. Fine granularity clustering for large scale placement problems. In *Proc. Intl. Symp. on Physical Design*, pages 67-74, 2003.

[12] D. S. Kershaw. The incomplete cholesky-conjugate gradient method for the iterative solution of systems of linear equations. *Journal of Computational Physics,* 26:43-65, 1978.

[13] J. Kleinhans, G. Sigl, F. Johannes, and K. Antreich. Gordian: VLSI placement by quadratic programming and slicing optimization. *IEEE Trans. Computer-Aided Design,* 10(3):356-365, 1991.

[14] F. Mo, A. Tabbara, and R. Brayton. A force-directed macro-cell placer. In *Proc. IEEE/ACM Intl. Conf. on Computer-Aided Design*, pages 177-180, 2000.

[15] C. Sechen and A. L. Sangiovanni-Vincentelli. Timberwolf 3.2: A new standard cell placement and global routing package. In *Proc. ACM/IEEE Design Automation Conf.*, pages 432-439, 1986.

[16] G. Sigl, K. Doll, and F. M. Johannes. Analytical placement: A linear or a quadratic objective function. In *Proc. ACM/IEEE Design Automation Conf.*, pages 427-431, 1991.

[17] P. Villarrubia. Important placement considerations for modern vlsi chips. In *Proc. Intl. Symp. on Physical Design*, page 6, 2003.

[18] J. Vygen. Algorithms for large-scale flat placement. In *Proc. ACM/IEEE Design Automation Conf.*, pages 746-751, 1997.

[19] M. Wang, X. Yang, and M. Sarrafzadeh. Dragon2000: Standard-cell placement tool for large industry circuits. In *Proc. IEEE/ACM Intl. Conf on Computer-Aided Design*, pages 260-263, 2000.

[20] M. C. Yildiz and P. H. Madden. Global objectives for standard cell placement. In *Proc. 11th Great Lakes Symposium on VLSI*, pages 68-72, 2001.

What is claimed is:

1. A method for efficient analytical placement of standard cell designs, comprising:
   (a) obtaining a placement of cells using a wire length objective function;
   (b) modifying the placement of cells by cell shifting in two dimensions to redistribute cells to thereby reduce cell overlap and provide a modified placement of cells;
   (c) adding spreading forces to the cells to prevent collapse into previous positions; and
   (d) refining the modified placement of cells to thereby reduce wire length using a half-perimeter bounding rectangle-measure.

2. The method of claim 1 wherein the hybrid net model of the placement uses the clique model for two-pin and three-pin nets and the star model for nets having at least four pins.

3. The method of claim 1 wherein the cell shifting comprises dividing a placement region into bins, computing utilization of each bin to contain cells, and shifting cells in the placement region based upon a bin in which each of the cells lies and current bin utilization.

4. The method of claim 1 wherein the step of adding spreading forces to the cells comprises connecting each cell to a corresponding pseudo point added at the boundary of the placement region.

5. The method of claim 1 further comprising assigning all standard cells to pre-defined rows in the placement region and within each row and assigning cells to legal positions.

6. The method of claim 1 further comprising fabricating an integrated circuit embodying the placement of cells.

7. An improvement to a quadratic method of placement of cells in a design, the improvement comprising:
   applying a cell shifting technique to remove cell overlap
   applying an iterative local refinement technique to reduce wire length according to a half-perimeter bounding rectangle-measure; and
   applying a hybrid net model comprised of a clique model and a star model, the clique model used for two-pin and three-pin nets and the star model used for nets having at least four pins to reduce a number of non-zero entries in a connectivity matrix.

8. The improvement to the quadratic method of placement of cells of claim 7 wherein the cell shifting comprises dividing a placement region into bins, computing utilization of each bin to contain cells, and shifting cells in the placement region based upon a bin in which each of the cells lies and current bin utilization.

9. An article of software for placing cells in a design for an integrated circuit, the article of software adapted to provide for
   (a) obtaining a placement of cells using a quadratic wire length objective function;
   (b) modifying the placement of cells by cell shifting to redistribute cells to thereby reduce cell overlap and provide a modified placement;
   (c) adding spreading forces to the cells to prevent collapse into previous positions; and
   (d) refining the modified placement of cells to thereby reduce wire length.

10. The article of software of claim 9 wherein the hybrid net model of the placement uses the clique model for two-pin and three-pin nets and the star model for nets having at least four pins.

11. The article of software of claim 9 wherein the cell shifting is cell shifting in two dimensions and wherein the cell shifting comprises dividing a placement region into bins, computing utilization of each bin to contain cells, and shifting cells in the placement region based upon a bin in which each of the cells lies and current bin utilization.

12. The article of software of claim 9 wherein the adding spreading forces to the cells comprises connecting each cell to a corresponding pseudo point added at the boundary of the placement region.

13. A method for efficient analytical placement of standard cell designs, comprising:
   (a) obtaining a placement of cells using a wire length objective function wherein the wire length objective function is a quadratic objective function solved using a hybrid net model comprised of a clique model and a star model;
   (b) modifying the placement of cells by cell shifting in two dimensions to redistribute cells to thereby reduce cell overlap and provide a modified placement of cells;

(c) adding spreading forces to the cells to prevent collapse into previous positions; and
(d) refining the modified placement of cells to thereby reduce wire length using a half-perimeter bounding rectangle-measure.

14. A method for efficient analytical placement of standard cell designs, comprising:
(a) obtaining a placement of cells using a wire length objective function solved using a hybrid net model which reduces a number of non-zero entries in a connectivity matrix;
(b) modifying the placement of cells by cell shifting in two dimensions to redistribute cells to thereby reduce cell overlap and provide a modified placement of cells;
(c) adding spreading forces to the cells to prevent collapse into previous positions; and
(d) refining the modified placement of cells to thereby reduce wire length using a half-perimeter bounding rectangle-measure.

15. An article of software for placing cells in a design for an integrated circuit, the article of software adapted to provide for
(a) obtaining a placement of cells using a quadratic wire length objective function which is solved using a hybrid net model comprised of a clique model and a star model;
(b) modifying the placement of cells by cell shifting to redistribute cells to thereby reduce cell overlap and provide a modified placement;
(c) adding spreading forces to the cells to prevent collapse into previous positions, a process which comprises connecting each cell to a corresponding pseudo point added at the boundary of the placement region; and
(d) refining the modified placement of cells to thereby reduce wire length.

* * * * *